United States Patent
Cha et al.

(10) Patent No.: US 10,503,221 B2
(45) Date of Patent: Dec. 10, 2019

(54) MOBILE TERMINAL

(71) Applicant: LG ELECTRONICS INC., Seoul (KR)

(72) Inventors: Youngdo Cha, Seoul (KR); Insoo Kim, Seoul (KR); Dongwon Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/055,816

(22) Filed: Aug. 6, 2018

(65) Prior Publication Data

US 2019/0196560 A1 Jun. 27, 2019

(30) Foreign Application Priority Data

Dec. 22, 2017 (KR) .................. 10-2017-0178630

(51) Int. Cl.
*G06F 1/20* (2006.01)
*H04M 1/02* (2006.01)

(52) U.S. Cl.
CPC .......... *G06F 1/203* (2013.01); *H04M 1/0277* (2013.01); *H04M 1/0279* (2013.01)

(58) Field of Classification Search
CPC ...... G06F 1/203; G06F 1/1637; G06F 1/1613; F24F 11/74; H05K 5/0213; H05K 5/03; H04M 1/0277; H04M 1/0249
See application file for complete search history.

(56) References Cited

U.S. PATENT DOCUMENTS

| | | | |
|---|---|---|---|
| 2009/0086430 A1* | 4/2009 | Kang | G02F 1/133385 361/695 |
| 2010/0177479 A1* | 7/2010 | Itazawa | H05K 7/20963 361/694 |
| 2011/0059717 A1 | 3/2011 | Much et al. | |
| 2011/0167845 A1* | 7/2011 | Lee | H05K 7/20972 62/89 |
| 2012/0105790 A1* | 5/2012 | Hubbard | G02F 1/133308 349/161 |
| 2012/0236499 A1* | 9/2012 | Murayama | H04N 5/64 361/696 |
| 2013/0194782 A1* | 8/2013 | Byun | H04M 1/02 362/97.1 |
| 2013/0271943 A1* | 10/2013 | Iwai | H05K 9/0007 361/816 |

(Continued)

FOREIGN PATENT DOCUMENTS

WO WO 2012/073513 A1 6/2012

*Primary Examiner* — James Wu
*Assistant Examiner* — Michael A Matey
(74) *Attorney, Agent, or Firm* — Birch, Stewart, Kolasch & Birch, LLP

(57) ABSTRACT

A mobile terminal includes a front case accommodating a display on a front surface and having a receiver for outputting a sound, a rear case coupled to one side of the front case, a rear cover covering a rear portion of the rear case to form an appearance and having an air vent hole allowing air to flow in and out to maintain predetermined pressure, and a circuit board installed been the front case and the rear case, wherein an air flow port is formed on an inner side surface of the rear cover and protrudes from the rear cover toward the rear portion of the case to guide movement of air formed by an external force acting on the rear cover.

18 Claims, 9 Drawing Sheets

(56) References Cited

U.S. PATENT DOCUMENTS

| | | | |
|---|---|---|---|
| 2014/0334100 A1* | 11/2014 | Yoon | H05K 7/20145 |
| | | | 361/692 |
| 2015/0366101 A1* | 12/2015 | Dunn | G02F 1/133385 |
| | | | 349/69 |
| 2016/0135286 A1* | 5/2016 | Hwang | H05K 1/189 |
| | | | 361/720 |
| 2016/0198589 A1* | 7/2016 | Kang | G02F 1/133385 |
| | | | 361/692 |
| 2017/0172016 A1* | 6/2017 | Kang | G09F 9/33 |
| 2017/0251564 A1 | 8/2017 | Jun et al. | |
| 2018/0088398 A1* | 3/2018 | Lee | H05K 7/20972 |
| 2018/0092241 A1* | 3/2018 | Rasmussen | H01R 24/60 |

\* cited by examiner

MOBILE TERMINAL

CROSS-REFERENCE TO RELATED APPLICATION

Pursuant to 35 U.S.C. § 119(a), this application claims the benefit of earlier filing date and right of priority to Korean Application No. 10-2017-0178630, filed on Dec. 22, 2017, the contents of which is incorporated by reference herein in its entirety.

BACKGROUND OF THE INVENTION

1. Field of the Invention

The present invention relates to a structure of a mobile terminal capable of guiding air moving inside a mobile terminal in a predetermined direction to limit the occurrence of abnormal noise during a call.

2. Background of the Invention

Terminals may be divided into mobile/portable terminals and stationary terminals according to mobility. Also, the mobile terminals may be classified into handheld types and vehicle mount types according to whether or not a user can directly carry.

The terminal has various functions according to development of technologies. For example, an electronic device can be allowed to capture still images or moving images, play music or video files, play games, receive broadcast and the like, so as to be implemented as an integrated multimedia player. Efforts are ongoing to support and increase the functionality of electronic devices. Such efforts include software improvements, as well as changes and improvements in the structural components.

In recent years, as design of terminals has become simpler and its thickness has become thinner, there has been a problem that the influence of air flow inside terminals is large. Particularly, in the case of a mobile terminal having a sealed structure for a waterproof specification, a noise or a abnormal noise of ticking is generated during a call due to flow of internal air generated due to an external force acting on the outside, causing inconvenience to users.

In order to solve the problem, a method of attaching a tape having a predetermined thickness to an outer surface of a battery or attaching a film having elasticity to a rear cover is used in order to reduce a space inside a terminal.

However, even when the space inside the terminal is reduced by attaching a tape or a film, air flow inside the terminal may be reduced but it is difficult to efficiently prevent flow of air flowing into the receiver, having a problem that it is difficult to prevent occurrence of abnormal noise, and since a tape or a film must be attached and manufactured according to a shape inside the terminal, it is disadvantageous in terms of cost. In addition, deformation may occur over time.

Therefore, research on a structure that may prevent generation of noise or abnormal noise during a call by reducing influence on a receiver by guiding flow of air inside a mobile terminal in a predetermined direction and reducing a movement speed of air toward the receiver is required.

SUMMARY OF THE INVENTION

Therefore, an aspect of the detailed description is to provide a structure of a mobile terminal capable of preventing generation of noise or abnormal noise generated in a receiver by guiding air flow inside generated according to pressure applied to the mobile terminal in a predetermined direction, while maintaining waterproof performance.

Another aspect of the detailed description is to provide a structure of a mobile terminal having a structure capable of minimizing an influence of air made on a receiver by lowering a speed of air moving along an air flow port.

To achieve these and other advantages and in accordance with the purpose of this specification, as embodied and broadly described herein, a mobile terminal includes: a front case accommodating a display on a front surface and having a receiver for outputting a sound; a rear case coupled to one side of the front case; a rear cover covering a rear portion of the rear case to form an appearance and having an air vent hole allowing air to flow in and out to maintain predetermined pressure; and a circuit board installed been the front case and the rear case, wherein an air flow port is formed on an inner side surface of the rear cover and protrudes from the rear cover toward the rear portion of the case to guide movement of air formed by an external force acting on the rear cover.

In an embodiment of the present invention, a bent portion having a predetermined curvature to reduce a movement speed of air moving toward the receiver may be provided in a plurality of locations to further increase a movement distance of air.

In an embodiment of the present invention, the air flow port may extend to a position adjacent to the air vent hole, guide movement of air along the inside of the air flow port, and extend on an inner side surface of the rear cover so as to be radially disposed.

In an embodiment of the present invention, a plurality of protrusions may be formed on an inner surface portion of the air flow port at a predetermined interval to increase a frictional force with moving air or a concavo-convex portion may be formed to increase a contact area with air on an inner surface.

In an embodiment of the present invention, the air flow port may be formed of a flexible material and may have a height greater than a space between the rear portion of the rear case and the inner side surface of the rear cover.

In an embodiment of the present invention, the air flow port may be disposed to be tightly attached between the rear portion of the rear case and the inner side surface of the rear cover.

In an embodiment of the present invention, the air flow port may be formed of a rubber material.

In an embodiment of the present invention, the air flow port may be integrally formed with the rear cover.

In an embodiment of the present invention, the air flow port may extend from a central portion of the inner side surface of the rear cover toward a corner of the rear cover.

In an embodiment of the present invention, the air moving along the air flow port is discharged to the outside through the air vent hole.

In an embodiment of the present invention, the air flow port is protruded from the inner surface of the rear cover toward the rear portion of the rear case.

In an embodiment of the present invention, the air flow port is formed in an area defined by an inner surface of the rear cover and a rear surface of the rear case.

In an embodiment of the present invention, a movement of air is formed along the air flow port by a force applied to the rear cover.

In an embodiment of the present invention, the air moving along the inside of the air flow port moves toward the receiver in a state where the air is reduced in speed, so that the pressure applied to the receiver is reduced.

In an embodiment of the present invention, the air flow port serves to guide the movement of the air.

In an embodiment of the present invention, the protrusions formed on an inner surface of the air flow port as well as on an inner surface of the rear cover.

According to the mobile terminal having the structure described above, air moving according to the pressure applied to the rear cover is guided to the air vent hole, instead of the receiver, while moving along the air flow port, thereby minimizing noise or abnormal noise generated in the receiver.

In addition, the air flow port has a plurality of bent portions to reduce a flow rate of air, thereby reducing the influence of air made on the receiver.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 8(*b*) is a conceptual view showing a shape of a concavo-convex portion formed in an air flow port.

DETAILED DESCRIPTION OF THE INVENTION

Figure 1A:
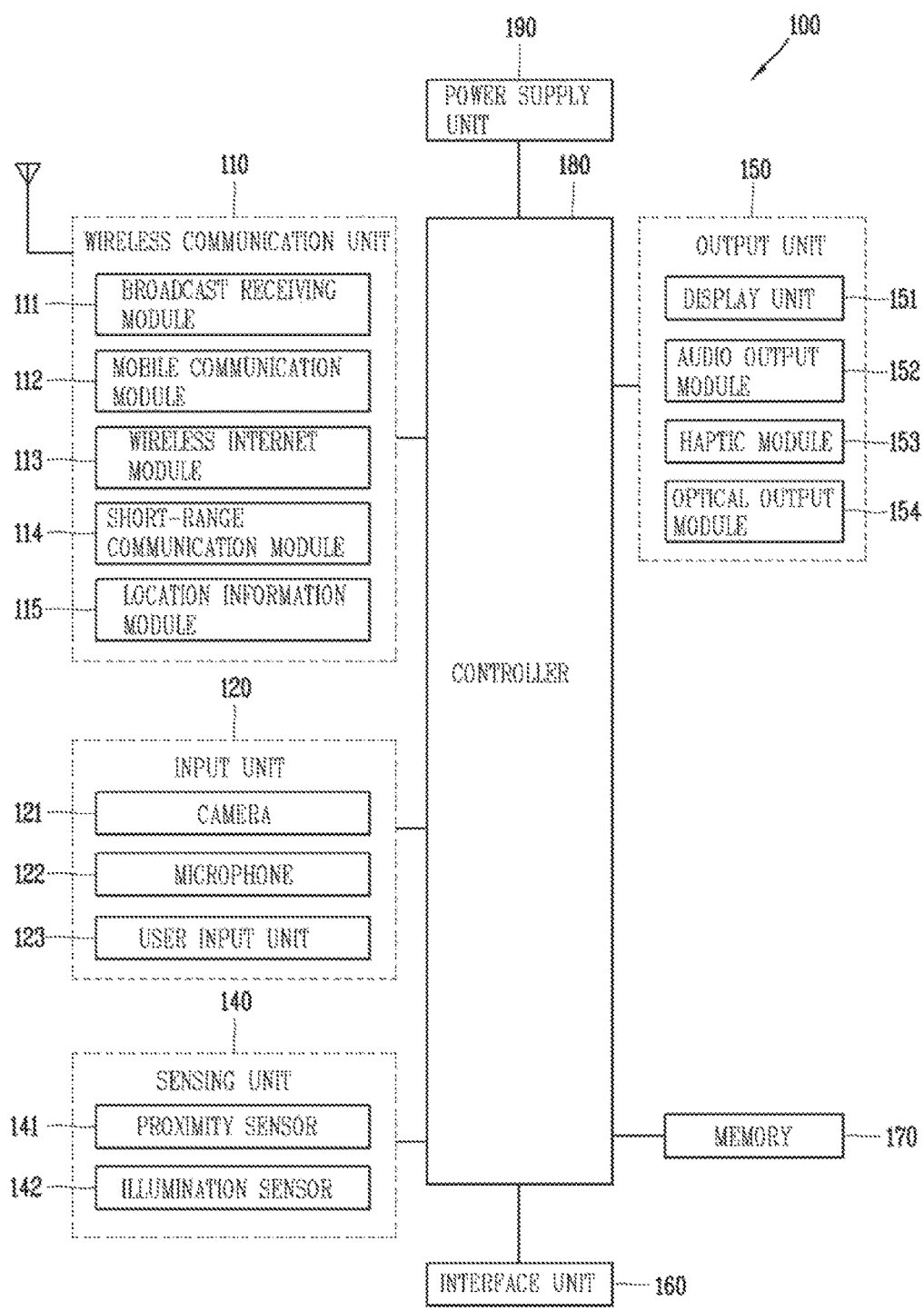
FIG. 1A is a block diagram for explaining a mobile terminal according to the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

FIG. 1A is a block diagram of a mobile terminal in accordance with one exemplary embodiment of the present invention.

The mobile terminal 100 may be shown having components such as a wireless communication unit 110, an input unit 120, a sensing unit 140, an output unit 150, an interface unit 160, a memory 170, a controller 180, and a power supply unit 190. FIG. 1 shows the mobile terminal 100 having various components, but it may be understood that implementing all of the illustrated components is not a requirement. Greater or fewer components may alternatively be implemented.

In more detail, among others, the wireless communication unit 110 may typically include one or more modules which permit communications such as wireless communications between the mobile terminal 100 and a wireless communication system, communications between the mobile terminal 100 and another electronic device, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal 100, the surrounding environment of the mobile terminal 100, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured as an embedded battery or a detachable battery.

At least part of the components may cooperatively operate to implement an operation, a control or a control method of the mobile terminal 100 according to various embodiments disclosed herein. Also, the operation, the control or the control method of the mobile terminal 100 may be implemented on electronic device by an activation of at least one application program stored in the memory 170.

Hereinafter, description will be given in more detail of the aforementioned components with reference to FIG. 1A, prior to describing various embodiments implemented through the mobile terminal 100.

First, regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules may be utilized to facilitate simultaneous reception of two or more broadcast channels, or to support switching among broadcast channels.

The mobile communication module 112 may transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

The wireless signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

Here, another mobile terminal may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the electronic device. As an example, the location information module 115 includes a Global Position System (GPS) module, a Wi-Fi module, or both. For example, when the mobile terminal 100 uses a GPS module, a position of the mobile terminal 100 may be acquired using a signal sent from a GPS satellite. As another example, when the mobile terminal 100 uses the Wi-Fi module, a position of the mobile terminal 100 may be acquired based on information related to a wireless access point (AP) which transmits or receives a wireless signal to or from the Wi-Fi module. If desired, the location information module 115 may alternatively or additionally perform a function of any of the other modules of the wireless communication unit 110 to obtain data related to the position of the mobile terminal 100. The location information module 115 is a module used for acquiring the position (or the current position) of the mobile terminal 100, and may not be limited to a module for directly calculating or acquiring the position of the mobile terminal.

Next, the input unit 120 is configured to permit various types of inputs to the mobile terminal 100. Examples of such inputs include image information (or signal), audio information (or signal), data or various information input by a user, and may be provided with one or a plurality of cameras 121. Such cameras 121 may process image frames of still pictures or video obtained by image sensors in a video or image capture mode. The processed image frames can be displayed on the display unit 151 or stored in memory 170. Meanwhile, the cameras 121 provided in the mobile terminal 100 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data may be processed in various manners according to a function (or application program) being executed in the mobile terminal 100. If desired, the microphone 122 may include assorted noise removing algorithms to remove unwanted noise generated in the course of receiving the external audio signal.

The user input unit 123 is a component that permits input by a user. Such user input may enable the controller 180 to control an operation of the mobile terminal 100 to correspond to input information. The user input unit 123 may include a mechanical input element (or a mechanical key, for example, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the electronic device at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the electronic device, surrounding environment information of the electronic device, user information, or the like, and generates a corresponding sensing signal. The controller 180 generally cooperates with the sending unit 140 to control operation of the mobile terminal 100 or execute data processing, a function or an operation associated with an application program installed in the mobile terminal 100 based on the sensing signal. The sensing unit 140 may be implemented using any of a variety of sensors, some of which will now be described in more detail.

The proximity sensor 141 refers to a sensor to sense presence or absence of an object approaching a surface, or an object located near a surface, by using an electromagnetic field, infrared rays, or the like without a mechanical contact. The proximity sensor 141 may be arranged at an inner region of the electronic device covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, the controller 180 may process data corresponding to proximity touches and proximity touch patterns sensed by the proximity sensor 141, and cause visual information corresponding to the processed data to be output on the touch screen. In addition, the controller 180 may control the mobile terminal 100 to execute different operations or process different data (or information) according to whether a touch with respect to a point on the touch screen is either a proximity touch or a contact touch.

A touch sensor senses a touch (or a touch input) applied to the touch screen (or the display unit 151) using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the touch screen, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

Meanwhile, the controller 180 may execute the same or different controls according to a type of touch object that touches the touch screen or a touch key provided in addition to the touch screen. Whether to execute the same or different control according to a type of an object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the object in vicinity of the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

Also, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 may provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 may output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal 100 emits monochromatic light or light with a plurality of colors to a front or rear surface. The signal output may be terminated as the mobile terminal 100 senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the mobile terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the electronic device therethrough. Various command signals or power input from the cradle may operate as signals for recognizing that the mobile terminal 100 is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control operations relating to application programs and the general operations of the mobile terminal 100. For example, the controller 180 may set or release a lock state for restricting a user from inputting a control command with respect to applications when a status of the electronic device meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 may control one or a combination of those components in order to implement various exemplary embodiments disclosed herein.

The power supply unit 190 receives external power or provides internal power and supply the appropriate power required for operating respective elements and components included in the wearable device 100 under the control of the controller 180. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Hereinafter, description will be given of a structure of the mobile terminal 100 according to the one embodiment of the present invention illustrated in FIG. 1A or a terminal having those components, with reference to FIG. 1C.

Figure 1B:
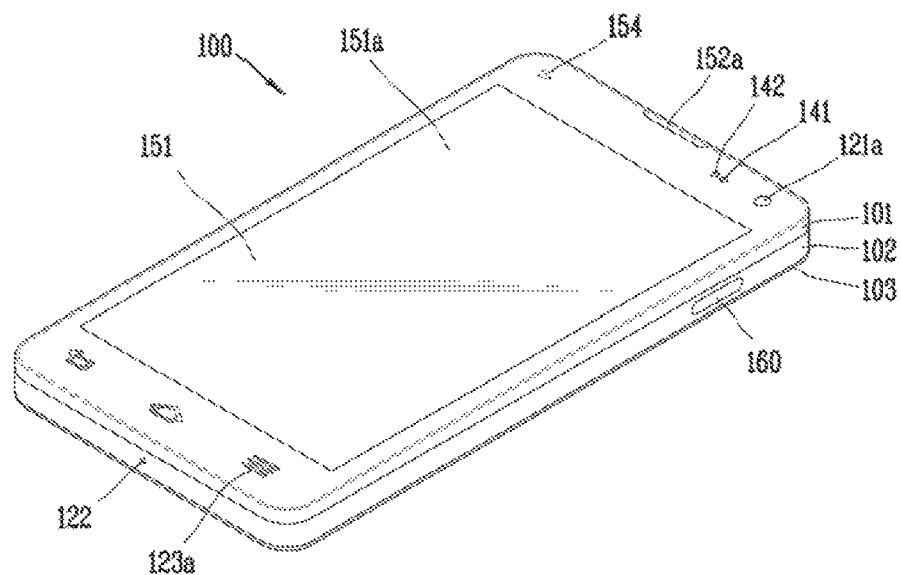
FIG. 1B is a perspective view of a front portion of a mobile terminal viewed from the outside.
Figure 1C:
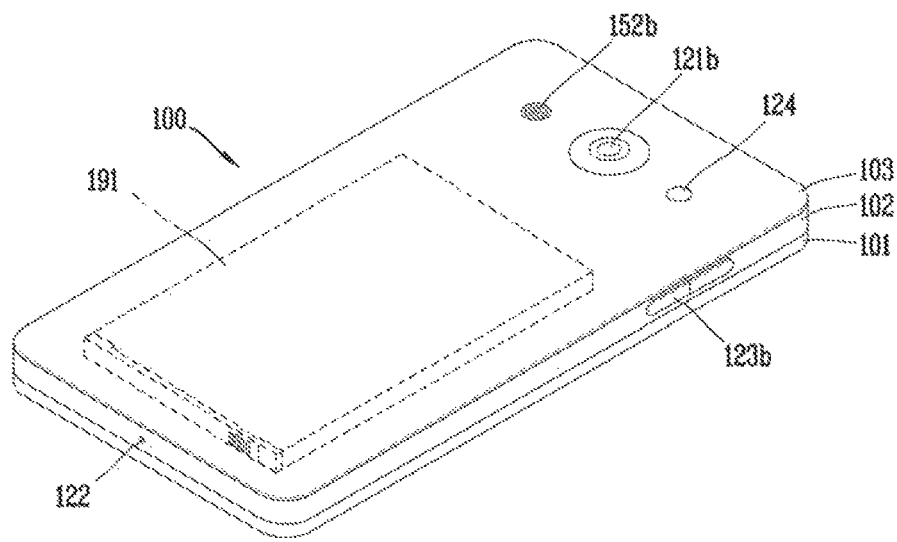
FIG. 1C is a perspective view of a rear portion of the mobile terminal viewed from the outside.

Referring to FIGS. 1B and 1C, the disclosed mobile terminal 100 includes a bar-like terminal body. However, the mobile terminal 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally be applied to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. In this case, a rear cover 103 is shown covering the electronic components, and this cover may be detachably coupled to the rear case 102. Therefore, when the rear cover 103 is detached from the rear case 102, the electronic components mounted on the rear case 102 are exposed to the outside.

As illustrated, when the rear cover 103 is coupled to the rear case 102, a side surface of the rear case 102 may partially be exposed. In some cases, upon the coupling, the rear case 102 may also be completely shielded by the rear cover 300. Meanwhile, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this case, an mobile terminal 100 having a uni-body is formed in such a manner that synthetic resin or metal extends from a side surface to a rear surface.

Meanwhile, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may be located on another surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be designated.

On the other hand, the touch sensor may be configured in a form of a film having a touch pattern and disposed between a window and a display (not illustrated) on a rear surface of the window, or may be a metal wire directly patterned on the rear surface of the window. Alternatively, the touch sensor may be formed integrally with the display. For example, the touch sensor may be disposed on a substrate of the display, or may be provided inside the display.

In this way, the display unit 151 may form a touch screen together with the touch sensor, and in this case, the touch screen may function as the user input unit (123, see FIG. 1A). In some cases, the touch screen may replace at least some of functions of a first manipulation unit 123a. Hereinafter, for the sake of explanation, the display unit (display module) for outputting the image and the touch sensor are collectively referred to as a touch screen 151.

The first audio output module 152a may be implemented as a receiver for transmitting a call sound to a user's ear and the second audio output module 152*b* may be implemented as a loud speaker for outputting various alarm sounds or multimedia playback sounds.

The window 151*a* of the display unit 151 may include a sound hole for emitting sounds generated from the first audio output module 152*a*. However, the present invention is not limited thereto, and the sounds may be released along an assembly gap between the structural bodies (for example, a gap between the window 151*a* and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121*a* may process image frames such as still or moving images obtained by the image sensor in a capture mode or a video call mode. The processed image frames can then be displayed on the display unit 151 or stored in the memory 170.

The first and second manipulation units 123*a* and 123*b* are examples of the user input unit 123, which may be manipulated by a user to provide input to the mobile terminal 100. The first and second manipulation units 123*a* and 123*b* may also be commonly referred to as a manipulating portion. The first and second manipulation units 123*a* and 123*b* may employ any method if it is a tactile manner allowing the user to perform manipulation with a tactile feeling such as touch, push, scroll or the like The first and second manipulation units 123*a* and 123*b* may also be manipulated through a proximity touch, a hovering touch, and the like, without a user's tactile feeling.

The drawings are illustrated on the basis that the first manipulation unit 123*a* is a touch key, but the present disclosure may not be necessarily limited to this. For example, the first manipulation unit 123*a* may be configured with a mechanical key, or a combination of a touch key and a push key.

The content received by the first and second manipulation units 123*a* and 123*b* may be set in various ways. For example, the first manipulation unit 123*a* may be used by the user to input a command such as menu, home key, cancel, search, or the like, and the second manipulation unit 123*b* may be used by the user to input a command, such as controlling a volume level being output from the first or second audio output module 152*a* or 152*b*, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152*a* or 152*b*, switching into a touch recognition mode of the display unit 151, or the like. The rear input unit may be implemented into a form allowing a touch input, a push input or a combination thereof.

The rear input unit may be disposed to overlap the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123*a* located on the front surface of the terminal body. Accordingly, when the first manipulation unit 123*a* is not disposed on the front surface of the terminal body, the display unit 151 may be implemented to have a larger screen.

On the other hand, the mobile terminal 100 may include a finger scan sensor which scans a user's fingerprint. The controller may use fingerprint information sensed by the finger scan sensor as an authentication means. The finger scan sensor may be installed in the display unit 151 or the user input unit 123.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121*b* may be further mounted to the rear surface of the terminal body. The second camera 121*b* may have an image capturing direction, which is substantially opposite to the direction of the first camera unit 121*a*.

The second camera 121*b* may include a plurality of lenses arranged along at least one line. The plurality of lenses may be arranged in a matrix form. The cameras may be referred to as an 'array camera.' When the second camera 121*b* is implemented as the array camera, images may be captured in various manners using the plurality of lenses and images with better qualities may be obtained.

The flash 124 may be disposed adjacent to the second camera 121*b*. When an image of a subject is captured with the camera 121*b*, the flash 124 may illuminate the subject.

The second audio output module 152*b* may further be disposed on the terminal body. The second audio output module 152*b* may implement stereophonic sound functions in conjunction with the first audio output module 152*a*, and may be also used for implementing a speaker phone mode for call communication.

At least one antenna for wireless communication may be disposed on the terminal body. The antenna may be embedded in the terminal body or formed in the case. For example, an antenna which configures a part of the broadcast receiving module 111 (see FIG. 1A) may be retractable into the terminal body. Alternatively, an antenna may be formed in a form of film to be attached onto an inner surface of the rear cover 300 or a case including a conductive material may serve as an antenna.

The terminal body is provided with a power supply unit 190 (see FIG. 1A) for supplying power to the mobile terminal 100. The power supply unit 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

On the other hand, the drawing illustrates that the rear cover 103 is coupled to the rear case 102 for shielding the battery 191, so as to prevent separation of the battery 191 and protect the battery 191 from an external impact or foreign materials. When the battery 191 is detachable from the terminal body, the rear case 300 may be detachably coupled to the rear case 102.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display unit 151 to extend the function of the mobile terminal 100. Another example of the accessory may be a touch pen for assisting or extending a touch input onto a touch screen.

Figure 2:
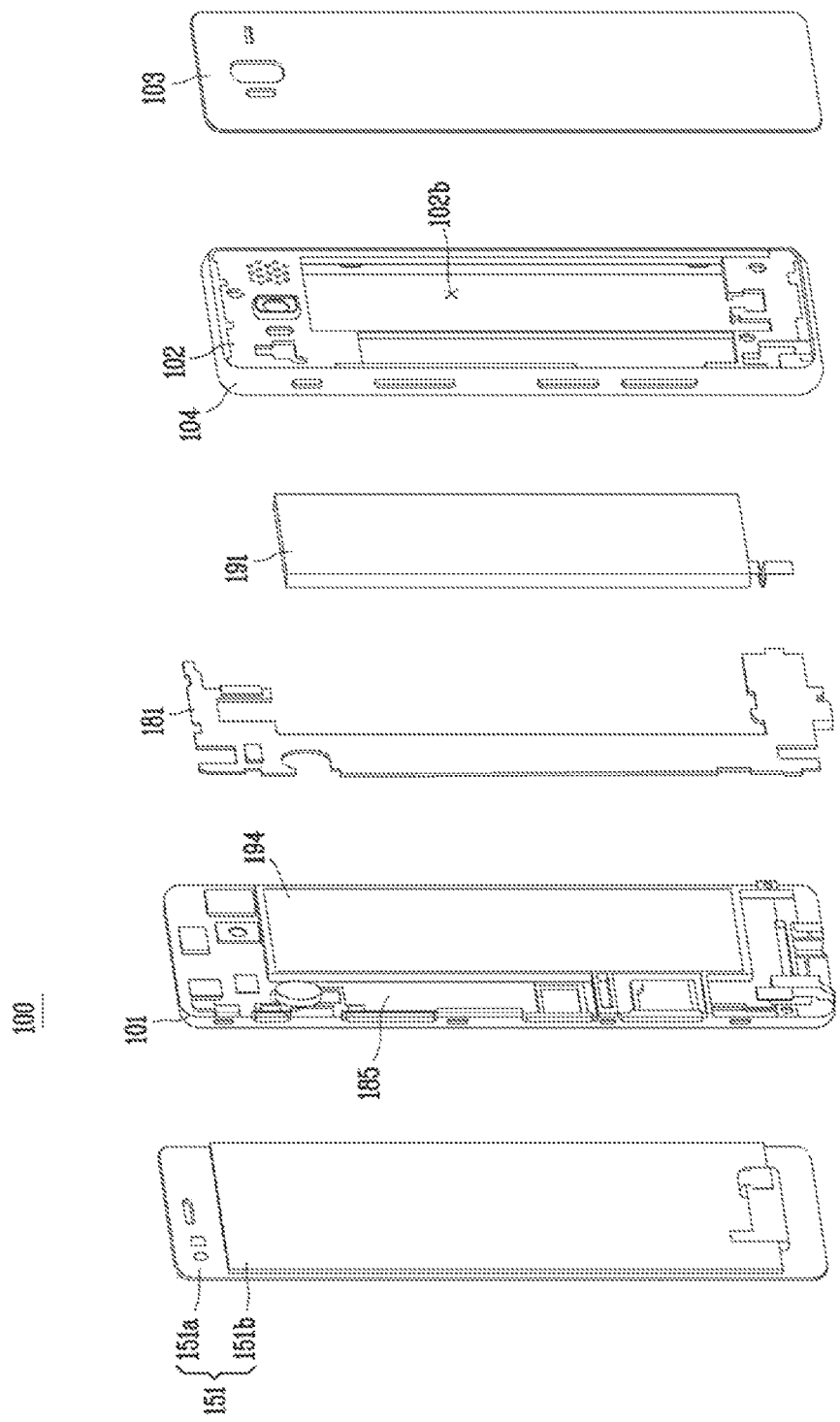
FIG. 2 is an exploded view of a mobile terminal according to the present invention.

FIG. 2 is an exploded view of the mobile terminal 100 according to the present invention.

The mobile terminal 100 according to the present invention includes a front case 101 in which a display unit 151 is received in a front portion thereof and a rear case 102 provided in a rear surface of the front case 101. The front case 101 and the rear case 102 form a predetermined space therein. The rear cover 103 is coupled to the rear surface portion of the rear case 102. A storage space for mounting the battery 190 may be formed on one surface of the rear case 102. The rear cover 103 may be mounted on the rear case 102 so as to cover the battery 190.

The rear case 102 is configured to form an appearance of a side surface of the mobile terminal 100. Here, the side surface of the mobile terminal 100 refers to a surface connecting the front surface and the rear surface, and the side surface portion may be formed of a metal member. When the side surface portion is formed of a metal member, it may perform the role of a radiator of an antenna.

A side case 104 may be separately provided on the side surface of the rear case 102. However, the rear case 102 and the side case 104 may be integrally formed.

Hereinafter, a structure of the mobile terminal in which the rear case 102 and the side case 104 are integrally formed will be described as an example.

A slit may be formed on the side surface of the rear case 102, and the slit (not shown) may be an ear jack hole or a USB port. A portion except for the side surface of the rear case 102 may be formed of a non-metal member in order to interrupt flow of a current when a current flows to the side surface of the rear case 102.

A main circuit board 181 and a battery 191 are positioned between the rear case 102 and the front case 101. The rear case 102 may have a hole 102b through which the battery 191 passes and a battery receiving part 194 may be formed in the front case 101.

The main circuit board 181 has a substantially 'ㄷ' shape or a 'C' shape and is electrically connected to an intermediate frame 185. A rear surface of the rear case 102 is covered by the rear cover 103. The main circuit board 181 is provided with a plurality of electronic devices 220 including a driving chip (not shown).

In the front case 101, a display 151 including a display panel 151b and a window 151a may be installed on the front surface. A receiver 110 for outputting a sound may be installed on one upper side of the front case 101.

In addition, the intermediate frame 185 made of a metal material may be installed on the inner side of the front case 101 so as to be able to operate as a ground (GND) and maintain sufficient rigidity. The main circuit board 181 or the antenna 130 may be grounded to the intermediate frame 185 and the intermediate frame 185 may operate as the ground GND of the main circuit board 181 or the antenna 130.

The main circuit board 181 is electrically connected to the antenna 130 and processes wireless signals (or radio electromagnetic waves) transmitted and received by the antenna 130. In order to process a wireless signal, a plurality of transmission/reception circuits may be formed or mounted on the main circuit board 181.

Figure 3A:
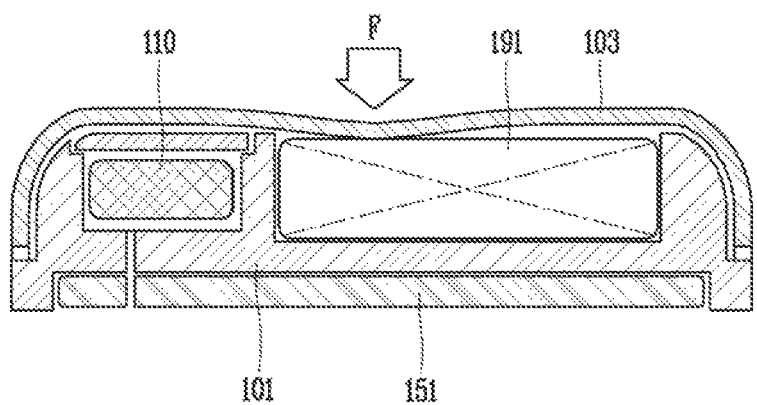
FIG. 3A is a conceptual diagram showing a state in which an outer shape changes finely when a force is applied to a rear cover.

FIG. 3A shows a state in which a force F acts on the rear cover 103 to change an outer shape minutely, and 3B is a conceptual diagram showing a movement path of air in a region between the rear cover 103 and the rear case 102 by a pressure based on the force F acting on the rear cover 103.

The rear cover 103 is positioned on the rear surface of the rear case 102 and the outer surface of the rear case 102 and the inner surface of the rear cover 103 are spaced apart from each other by a predetermined distance. Here, the outer surface of the rear case 102 refers to a surface that faces the rear cover 13, and the inner surface of the rear cover 103 refers to an inner surface of the rear cover 103 that faces the rear case 102.

Recently, mobile terminals 100 generally have waterproof performance as a basic specification. In order to secure waterproof performance, a waterproof tape 105 is provided on the rear surface portion of the rear case 102 and along an outer circumferential portion of the inner side surface of the rear cover 103 to prevent an introduction of water from the outside.

A predetermined space is formed between the outer surface of the rear case 102 and the inner surface of the rear cover 103. When the user grasps the mobile terminal 100, when the mobile terminal is pressed by a body part, or when the mobile terminal is pressed by an article having a predetermined weight, pressure acts on the rear cover 103, and pressure acting in a space between the rear cover 103 and the rear case 102 forms movement of accommodated air to affect the receiver 110 to generate abnormal noise during a call.

For example, as shown in FIG. 3A, when the user grasps the mobile terminal 100 for a call, a force F having a predetermined magnitude or greater may be applied to the rear cover 103. In this case, the shape of the rear cover 103 is finely recessed to the inside of the mobile terminal 100 to reduce the space between the rear cover 103 and the rear case 102, forming movement of air accommodated inside.

Figure 3B:
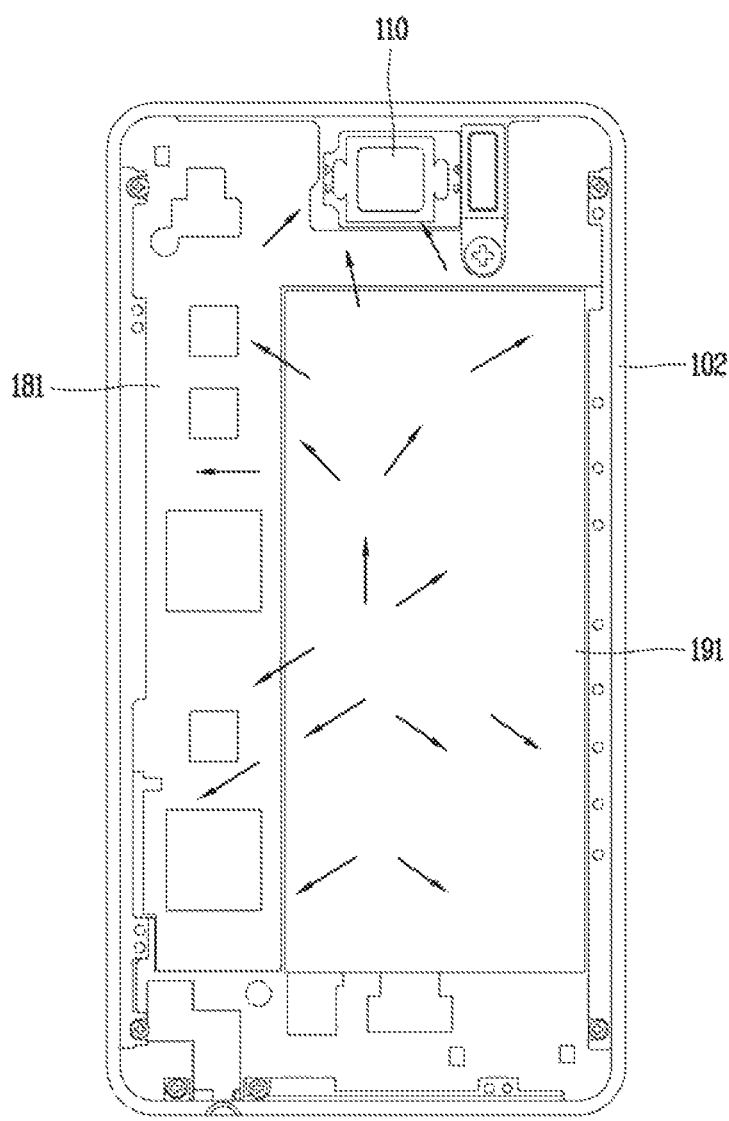
FIG. 3B is a conceptual diagram showing a state in which air accommodated between a rear case and a rear cover moves based on a point where an external force acts on the rear cover.

FIG. 3B shows a state in which air accommodated between the rear case 102 and the rear cover 103 moves around a point where a predetermined amount of pressure F acts. The movement of the air is formed by internal pressure generated as the force F acts on the rear cover 103 by a predetermined magnitude or greater. In this case, the air has a random movement path without a predetermined pattern in the directions of the arrows and instantaneously moves toward the receiver 110 to apply pressure to a diaphragm (not shown), causing generation of abnormal noise during a call.

Figure 4:
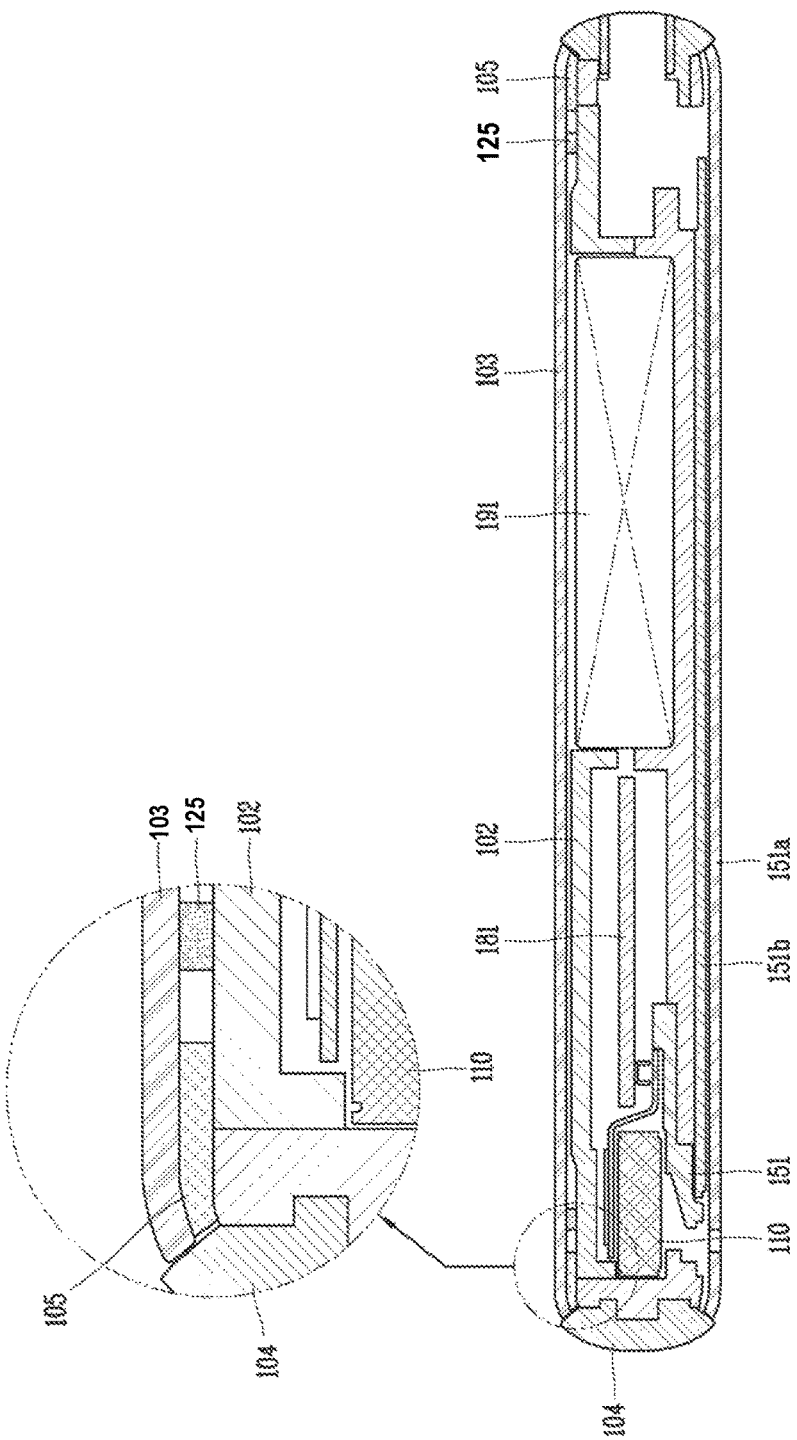
FIG. 4 is a cross-sectional view of a mobile terminal according to the present invention.
Figure 5:
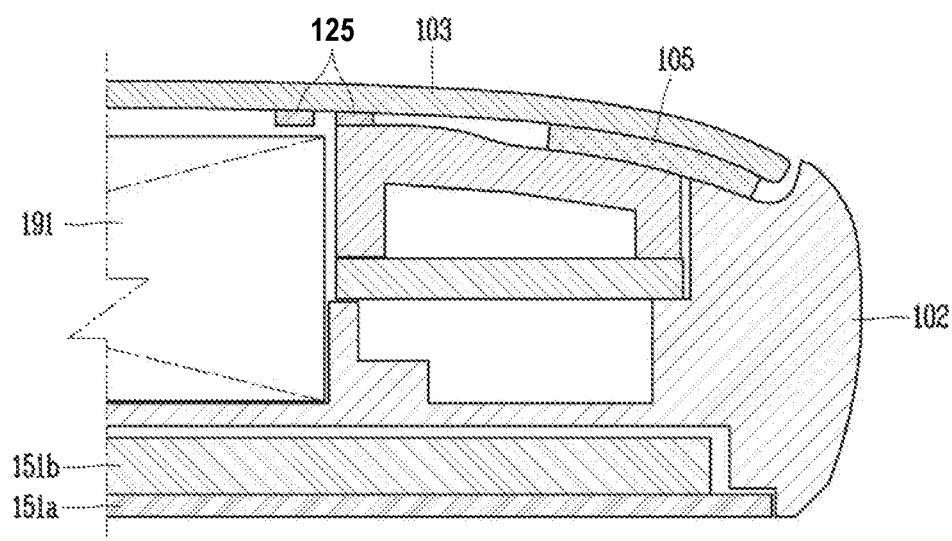
FIG. 5 is an enlarged view of an inside of the mobile terminal of FIG. 4.

FIG. 4 is a cross-sectional view of the mobile terminal 100 according to the present invention, and FIG. 5 is an enlarged view of the inside of the mobile terminal 100.

The display 151 including a window 151*a* on which a touch sensor (not shown) is mounted and a display panel 151*b* is installed on the front surface of the mobile terminal 100. The display unit 151 (see FIG. 2B) is configured to include the window 151*a*, the display panel 151*b*, and a display frame 151*c*.

A touch sensor (not shown) is formed to sense a touch input and is formed to be light transmissive. The touch sensor is mounted on a front surface of the window 151*a* and may be configured to convert a change in voltage, or the like, generated in a specific portion of the window 151*a* into an electrical input signal.

The window 151*a* may be made of a material through which light may be transmitted, for example, a light-transmissive synthetic resin, a tempered glass, or the like. The window 151*a* may include a portion that may not transmit light, and the portion where the light may not pass through may be configured such that a pattern film separately covers the window 151*a*. The pattern film may be configured such that the center is transparent and the edges are opaque. The display panel 151*b* is disposed on the rear surface of the window 151*a*.

The display panel 151*b* may be variously configured as a liquid crystal display (LCD), an organic light-emitting diode (OLED), a flexible display, a three-dimensional (3D) display. A backlight unit (not shown) may be disposed on the rear surface of the display panel 151*b*, and the display panel 151*b* and the backlight unit may be respectively supported by the display frame 151*c*.

Also, as illustrated in FIG. 4, the front case 101 and the rear case 102 are provided inside the mobile terminal 100, and the circuit board 181 and the receiver 110 connected to the circuit board 181 are installed in an inner region formed by the front case 101 and the rear case 102. The circuit board 181 may be mounted on the rear case 102 and the circuit board 181 may be configured as an example of the controller 180 (see FIG. 1) for operating various functions of the mobile terminal 100.

The receiver 110 refers to a sound output element. The receiver 110 plays a role of a speaker which changes an electrical signal into a vibration signal to transmit a sound. The receiver 110 may convert an electrical signal into a vibration signal in various manners to transmit a sound. For example, it is also possible to transmit a sound using bone conduction vibration.

The receiver 110 is configured to include a housing (not shown) that forms an appearance and a plurality of diaphragms (not shown) that are positioned inside the housing, and may transmit a sound through vibration. When a pressure equal to or greater than a certain magnitude is applied to the diaphragm, a call sound may be distorted or a noise such as abnormal noise may be generated.

Particularly, in the case of the mobile terminal 100 having the conventional waterproof performance as a specification, when the pressure acts on the space formed between the rear case 102 and the rear cover 103, air accommodated in the space moves to apply pressure to the receiver 110, having a structure susceptible to generation of abnormal noise.

In the mobile terminal 100 according to the present invention, in order to ensure waterproof performance, a waterproof tape 105 is positioned between the rear cover 103 and the rear case 102 to prevent penetration of moisture to the space between the rear cover 103 and the rear case 102. Here, the waterproof tape 105 may be positioned along the circumference of the inner surface of the rear cover 103 and the outer surface of the rear case 102. The waterproof tape 105 is preferably made of a material ensuring elasticity, and may be made of a highly elastic material.

When the waterproof tape 105 is formed between the circumferential portion of the inner side surface of the rear cover 103 and the circumferential portion of the outer side surface of the rear case 102 to form an airtight space in the mobile terminal 100, if an external force is applied toward the rear cover, air flow is generated inside the mobile terminal 100.

In the mobile terminal 100 according to the present invention, in order to prevent pressure from being applied to the diaphragm (not shown) of the receiver 110 as air instantly moves toward the receiver, an air flow port 125 is formed on an inner side surface of the rear cover 103 and protrudes toward a rear surface portion of the rear case 102 from the rear cover 103 to guide movement of air.

In the case of the mobile terminal 100 equipped with the waterproof function, an air vent hole 130 through which air may flow in and out is provided for balancing pressure between the inside and the outside of the mobile terminal 100. In the case of the mobile terminal 100 according to the present invention, since air flow due to pressure formed inside the mobile terminal as the shape of the rear cover 103 is changed by an external force applied to the rear cover 103 is guided toward the air vent hole 130, not the receiver 110, whereby generation of abnormal noise in the receiver during a call may be limited.

At this time, the air moving inside the mobile terminal 100 moves along the air flow port 125 so as to be reduced in a movement speed, whereby a flow rate of air toward the receiver 110 may be reduced. Accordingly, since relatively low air pressure is applied to the receiver 110, generation of abnormal noise that affects call quality may be limited.

Figure 6:
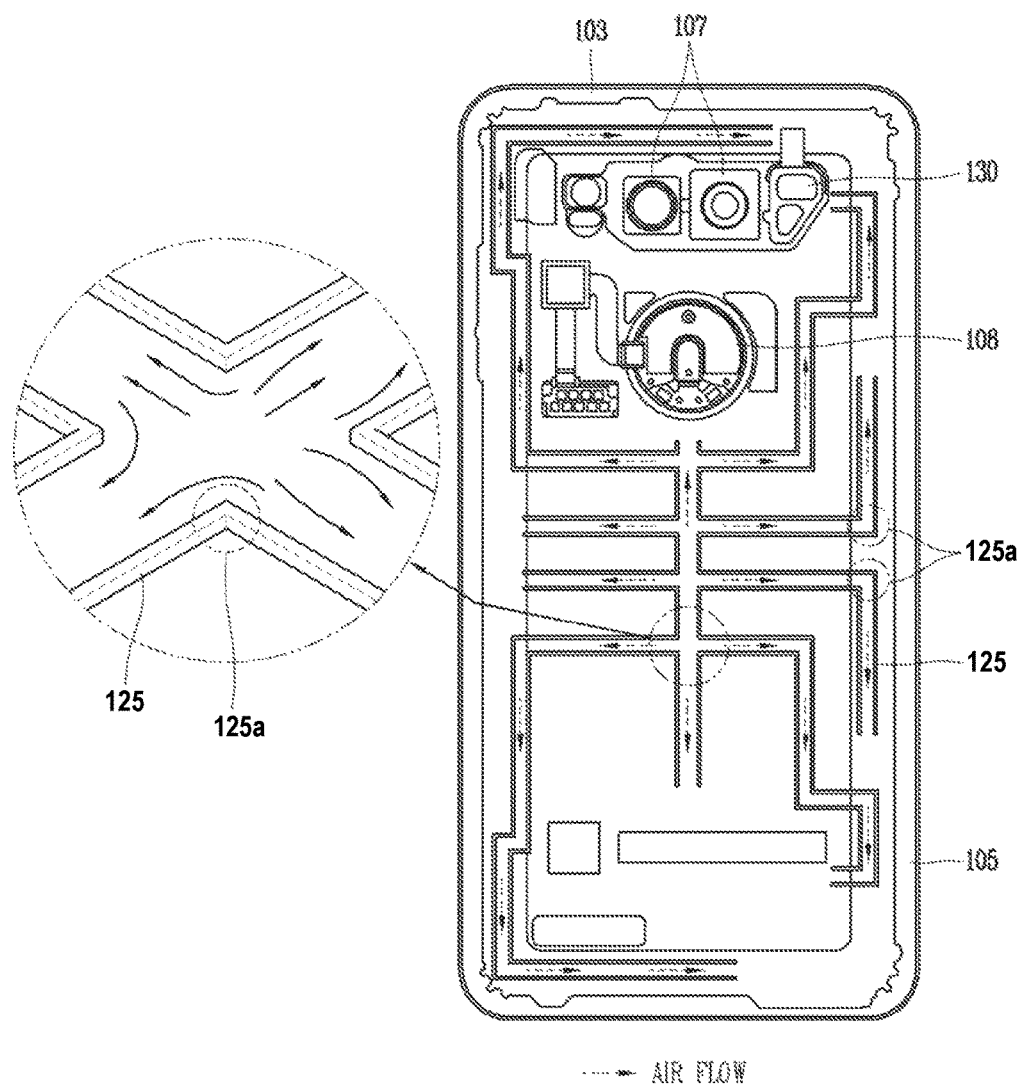
FIG. 6 is a conceptual view showing an air flow port formed on an inner surface of a rear cover.

FIG. 6 is a view showing an inner side surface of the rear cover 103. A camera deco 107 and an air vent hole 130 are arranged in parallel with each other at an upper portion of the rear cover 103 and a fingerprint recognition sensor 108 is installed below the air vent hole 130.

The air flow port 125 may be formed on the inner side surface of the rear cover 103. The air flow port 125 protrudes toward the rear surface portion of the rear case 102 to guide air movement. In the air flow port 125, protrusions arranged to face each other and at a predetermined space extend along the rear cover 103. The air flow port 125 serves to guide air moving inside the mobile terminal 100, while in contact with the inner surface of the air flow port 125 by the pressure applied to the rear cover 103.

The air flow port 125 may protrude from the inner side surface of the rear cover 103 and extend from the center of the inner side surface of the rear cover 103 toward the respective corners. The air flow port 125 extends to a position adjacent to the air vent hole 130 and most of flowing air is guided to the air vent hole 130.

As illustrated in FIG. 6, the air flow port 125 extending as one body may be divided into a plurality of branches to form a radial pattern, and the air flow port 125 may extend to a position adjacent to the air vent hole 130. The air flow port 125 guides movement of air formed by a force applied to the rear cover 103 to the air vent hole 130. However, the shape of the air flow port 125 illustrated in FIG. 6 is merely an example, and the air flow port 125 formed on the inner side surface of the rear cover 103 may include bent portions 125a at a plurality of locations to have shapes of various patterns.

The air flow port 125 forms a passage for air through a space defined by a rear surface portion of the rear case 102 and an inner side surface of the rear cover 103. In order to reduce a speed of air moving along the inside of the air flow port 125, the air flow port 125 may have a bent portion 125a having a predetermined curvature. The bent portion 125a has a bent shape at a predetermined angle, thereby extending a movement path of air moving along the inner surface portion of the air flow port 125. The movement speed of air is reduced as air passes by the bent portion 125, and when the movement speed of air is reduced, pressure applied by air to the receiver is lowered to prevent generation of abnormal noise during a call.

The mobile terminal 100 according to the present invention preferably has a maximum number of bent portions 125a in the air flow port 125 so that smooth flow of air passing through the air flow port 125 is interrupted by the bent portion 125a to lower a speed of air. In this case, the speed of air toward the receiver 110 may be minimized.

The air flow port 125 may be made of a flexible material and the air flow port 125 may be formed to have a height greater than a space between the rear surface portion of the rear case 102 and the inner side surface of the rear cover 103, so as to be compressed and adhered between the rear surface portion of the rear case 102 and the inner side surface of the rear cover 103. The air flow port 125 may be made of a rubber material. The air flow port 125 may be formed integrally with the rear cover 103.

As shown in the enlarged view of FIG. 6, the protrusions constituting the air flow port 125 may be configured such that the outer side surface is flat and the corners are angled. As a result, the area which is in contact with the rear cover 103 may be increased, thereby preventing leakage of air flowing through the air flow port 125.

Figure 7:
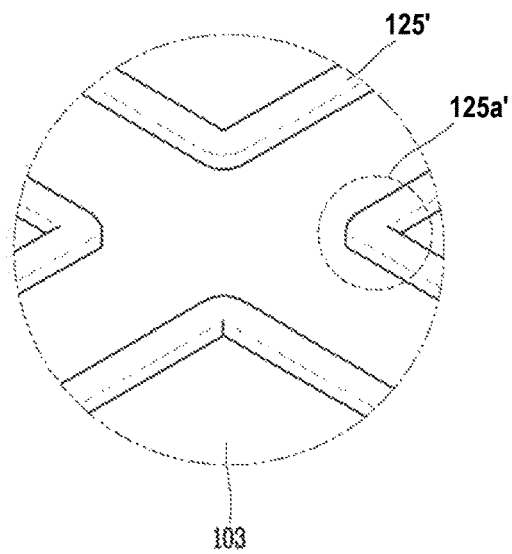
FIG. 7 is a conceptual view showing a modification of an air flow port according to another embodiment of the present invention.

FIG. 7 shows a modification of the air flow port 125'. The protrusions constituting the air flow port 125' may be configured such that the corners of the outer side surface are rounded and positioned to be tightly attached to a rear case 102'. In the case where the corners of the protrusions are rounded, a contact area with air at the bent portion 125a' having a predetermined curvature may be increased and a movement speed of air may be effectively reduced.

Figure 8:
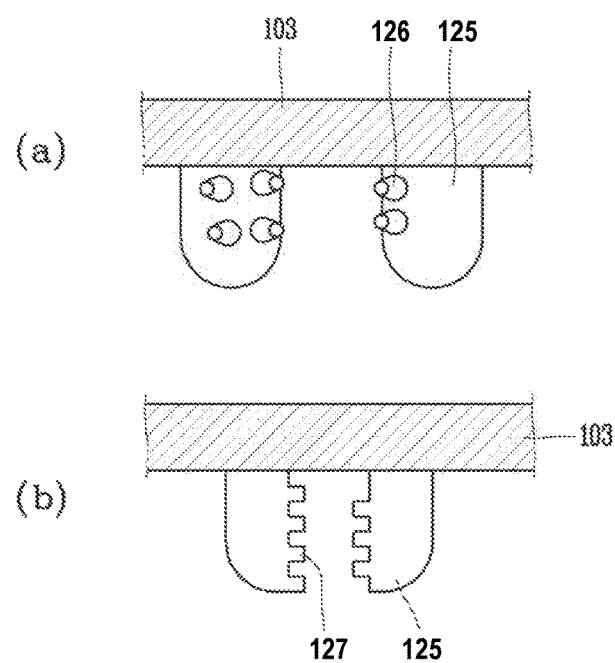
FIG. 8(*a*) is a conceptual view showing a shape of a protrusion formed in an air flow port.

FIGS. 8A and 8B are enlarged views showing a state of the air flow port 120.

As shown in FIG. 8A, an inner surface of the air flow port 125 may include a plurality of protrusions 126 spaced apart from each other at a predetermined distance so as to increase a contact area with air to reduce a flow rate of air. Air that moves due to the pressure applied to the rear cover 103 may come into contact with the respective protrusions 126 formed on the air flow port 125 and reduced in movement speed. In this case, since the movement speed of air is reduced, pressure applied to the receiver 110 by air may be lowered. Also, each protrusions 126 may be formed not only on the inner surface of the air flow port 125 but also on the surface of the inner rear cover 103 of the air flow port 125.

FIG. 8B is a view showing a state in which a concavo-convex portion 127 is formed in the air flow port 125. The area in which air moving due to pressure applied to the rear cover 103 is in contact with the concavo-convex portion 127 formed in the air flow port 125 increases to reduce a flow rate of air. When the movement speed of air is reduced, pressure applied to the receiver 110 by air is lowered, thereby preventing generation of abnormal noise during a call.

Accordingly, the detailed description should not be construed as being limitative from all aspects, but should be construed as being illustrative. The scope of the present invention should be determined by reasonable analysis of the attached claims, and all changes within the equivalent range of the present invention are included in the scope of the present invention.

What is claimed is:

1. A mobile terminal comprising:
   a front case accommodating a display on a front surface and having a receiver for outputting a sound;
   a rear case coupled to one side of the front case;
   a rear cover covering a rear portion of the rear case to form an appearance and having an air vent hole allowing air to flow in and out to maintain a predetermined pressure; and
   a circuit board installed between the front case and the rear case,
   wherein an air flow port is formed on an inner side surface of the rear cover and protrudes from the rear cover toward the rear portion of the rear case to guide movement of air formed by an external force acting on the rear cover,
   wherein the air flow port has bent portions having a predetermined curvature on a same plane to reduce a movement speed of air moving toward the receiver, and
   wherein a plurality of protrusions are formed on an inner surface portion of the air flow port to increase a frictional force with moving air.

2. The mobile terminal of claim 1, wherein the bent portions are formed in a plurality of locations of the air flow port.

3. The mobile terminal of claim 1, wherein the air flow port extends to a position adjacent to the air vent hole.

4. The mobile terminal of claim 3, wherein movement of air is guided along the inside of the air flow port, and the air flow port extends on an inner side surface of the rear cover so as to be radially disposed.

5. The mobile terminal of claim 1, wherein a concavo-convex portion is formed on an inner surface portion of the air flow port to increase a contact area with air.

6. The mobile terminal of claim 1, wherein the air flow port is formed of a flexible material.

7. The mobile terminal of claim 1, wherein the air flow port has a height greater than a space between the rear portion of the rear case and the inner side surface of the rear cover.

8. The mobile terminal of claim 7, wherein the air flow port is disposed to be tightly attached between the rear portion of the rear case and the inner side surface of the rear cover.

9. The mobile terminal of claim 8, wherein the air flow port is formed of a rubber material.

10. The mobile terminal of claim 1, wherein the air flow port is integrally formed with the rear cover.

11. The mobile terminal of claim 1, wherein the air flow port extends from a central portion of the inner side surface of the rear cover toward a corner of the rear cover.

12. The mobile terminal of claim 1, wherein the air moving along the air flow port is discharged to the outside through the air vent hole.

13. The mobile terminal of claim 1, wherein the air flow port is protruded from the inner surface of the rear cover toward the rear portion of the rear case.

14. The mobile terminal of claim 13, wherein the air flow port is formed in an area defined by an inner surface of the rear cover and a rear surface of the rear case.

15. The mobile terminal of claim 1, wherein a movement of air is formed along the air flow port by a force applied to the rear cover.

16. The mobile terminal of claim 1, wherein the air moving along an inside of the air flow port moves toward the receiver in a state where the air is reduced in speed, so that a pressure applied to the receiver is reduced.

17. The mobile terminal of claim 1, wherein the air flow port serves to guide the movement of the air.

18. The mobile terminal of claim 1, wherein the protrusions are formed on an inner surface of the air flow port as well as on an inner surface of the rear cover.

* * * * *